United States Patent [19]

Seidel

[11] 4,090,147
[45] May 16, 1978

[54] INTERFEROMETRIC AMPLIFIER

[75] Inventor: Harold Seidel, 40 Skyline Dr., Warren, N.J. 07060

[73] Assignee: Bell Telephone Laboratories, Incorporated, Murray Hill, N.J.

[21] Appl. No.: 817,354

[22] Filed: Jul. 20, 1977

[51] Int. Cl.² .............................................. H03F 3/38
[52] U.S. Cl. ...................................... 330/10; 330/53; 330/124 R; 332/17; 332/23 A
[58] Field of Search ...................... 330/10, 53, 124 R; 332/17, 22, 23 A

[56] References Cited

U.S. PATENT DOCUMENTS 3,777,275  12/1973  Cox ........................................ 330/10

Primary Examiner—James B. Mullins
Attorney, Agent, or Firm—Henry T. Brendzel

[57] ABSTRACT

Improved interferometric amplification is achieved by separating the input signal in accordance with the signal's projection on two orthogonal reference signals, with one of the reference signals capable of following the instantaneous frequency of the input signal. The separated signals are further separated into constant amplitude variable phase signal pairs defining the projected signals, and the constant amplitude signals are amplified and appropriately combined to form a signal that is in an amplified replica of the input signal.

10 Claims, 3 Drawing Figures

INTERFEROMETRIC AMPLIFIER

BACKGROUND OF THE INVENTION

1. Field of the Invention

This invention relates to amplification circuits and, more particularly, to circuits for providing linear bandpass amplification of high frequency signals by interferometric techniques.

2. Description of the Prior Art

Amplification comprises one of the most basic concepts in the art of electronic circuits. Yet, when it comes to efficient, high frequency, high power operation, amplifiers still suffer from distortion, power waste and intermodulation interference problems.

A number of the investigators who have studied the problem have developed interferometric techniques for circumventing the problem. These techniques generally contemplate separating the signal into at least two channels, amplifying the separated signals in constant modulus amplifiers and combining the amplified signals to form the final signal.

M. I. Jacobs in U.S. Pat. No. 3,248,663, issued Apr. 26, 1966, describes a number of interferometric amplifier systems. In one embodiment (FIG. 1), the signal to be amplified is decomposed into two constant amplitude signals with one signal being 180° out of phase with the input and the other signal being also out of phase with the input but with the phase being a function of the amplitude of the input signal. Although recombining these constant amplitude signals forms a signal whose amplitude is proportional to the amplitude of the input signal, the phase of the recombined signal is not in congruence with the phase of the input signal. In another embodiment (FIG. 5), the signal to be amplified is decomposed into two equal, though not constant, amplitude signals symmetrically centered about a signal vector situated 90° away from the input signal. This is achieved by forming the signals $x(t)\cos(\omega t-90)+\cos\omega t$ and $x(t)\cos(\omega t-90)-\cos\omega t$ from the input signal $x(t)\cos\omega t$. As before (in his FIG. 1), recombining these equal amplitude signals forms a signal whose amplitude is proportional to the amplitude of the input signal but whose phase is not in congruence with that of the input signal. In this embodiment, however, the phase of the developed signal is fixed at 90° away from the input signal.

D. C. Cox in U.S. Pat. No. 3,777,275, issued Dec. 4, 1973, (and in "Component Signal Separation and Recombination for Linear Amplification with Nonlinear Components," IEEE Transactions on Communications, Nov. 1975, pp. 1281-1289) employs the symmetric approach described by Jacobs, but he develops two equal and constant amplitude signals which straddle the input signal. Mathematically, what Cox does can be represented by rewriting the general expression for band limited signals $$v(t) = x(t) \cos[\omega t + \theta(t)], \quad (1)$$

where $\omega$ is the center frequency and $\omega + \theta(t)$ is the instantaneous frequency, in the form $$v(t) = E\{\cos[\omega t+\theta(t)+\phi(t)]+\cos[\omega t+\theta(t)-\phi(t)]\} \quad (2)$$

where $\phi(t) = \cos^{-1}[x(t)/2E]$; resulting in two constant amplitude signals which lead and lag, respectively, the signal $\cos[\omega t+\theta(t)]$ by the phase angle $\phi(t)$. This may better be visualized with reference to FIG. 1, where the signal of Equation (1) is depicted as a rotating signal vector 11 which leads the reference signal vector cos $\omega t$ by phase angle $\theta(t)$. Cox decomposes signal vector 11 into signal vectors 12 and 13, of magnitude E, to straddle the input signal. From FIG. 1 it appears clear that the addition of signal vectors 12 and 13 yields the original signal with the correct amplitude and the appropriate phase angle. Signal vectors 12 and 13 are easily constructed by employing a circle of radius 2E, applying a cord at the tip of signal vector 11 which is perpendicular thereto, and extending signal vectors 12 and 13, of magnitude E, toward the intersections of the cord with the circle. It may be observed that for all values of signal vector 11 (of magnitude less than 2E) a set of signal vectors 12 and 13 can always be found and that the accuracy of representing signal vector 11 with signal vectors 12 and 13 depends on the accuracy with which the angle $\theta(t)$ is known.

In realizing the amplifier, Cox converts the input signal $x(t)\cos(\omega t+\theta(t))$ into a constant amplitude signal $E\cos(\omega t+\theta(t))$, phase modulates the constant amplitude signal with $+\phi(t)$ and $-\phi(t)$ to develop the two signal vectors 12 and 13, amplifies signal vectors 12 and 13 with constant modulus amplifiers, and combines the amplified signals to form an amplified replica of the input signal.

The Cox approach is very good for signals which can conveniently be hard limited to form the constant amplitude reference $E\cos(\omega t+\theta(t))$. When dealing with modulated signals, however, when the amplitude of the modulated signal has both positive and negative excursions, phase discontinuities occur during zero transitions in the modulated signal's envelope. When hard limiting is undertaken to develop the signal $E\cos(\omega t+\theta(t))$, the phase discontinuities have the same effect, with respect to developed sidebands, as a carrier being modulated by a square wave having very sharp transitions. Because of the extremely wide band developed in the sidebands when a carrier is modulated by a square wave, it can be shown that relatively narrow band determinations lead to significant errors in approximating the signal $\cos[\omega t+\theta(t)]$.

Another well known decomposition of band limited signals which is described, among others, by D. K. Weaver in "A Third Method for Generation and Detection of Single Sideband Signals," Proceedings of the IRE, Vol. 44, Dec. 1956, pp. 1703-1705, relates the signal of Equation (1) to the two orthogonal signals cos $\omega t$ and sin $\omega t$. That is, Equation (1) is expressed as $$v(t) = [x(t)\cos\theta(t)]\cos\omega t - [x(t)\sin\theta(t)]\sin\omega t. \quad (3)$$

This decomposition, which is illustrated in FIG. 2, need not be limited to the orthogonal set sin $\omega t$ and cos $\omega t$. It is valid for any orthogonal set of reference signals, and this includes the set $\cos(\omega t+\xi)$ and $\sin(\omega t+\xi)$, where $\xi$ is zero, fixed, or variable, including a $\xi$ value approximately equal to Cox's $\theta(t)$.

SUMMARY OF THE INVENTION

It is an object of this invention to combine the advantages of the Cox approach and the approach described by Weaver and to provide thereby apparatus suitable for high fidelity high frequency amplification by interferometric techniques.

This and other objects are achieved by employing two orthogonal reference signals, by defining the input signal in accordance with the projection of the input signal on the orthogonal references, by redefining each projection signal in accordance with Cox's constant amplitude signals and by appropriately recombining amplified replicas of the constant amplitude signals. The reference signals may be set at the constant or average frequency of the input signal, or to increase the efficiency of the system, one of the reference signals may be set to generally follow the instantaneous frequency of the input signal (while the other reference signal is made orthogonal thereto).

DETAILED DESCRIPTION

Figure 1:
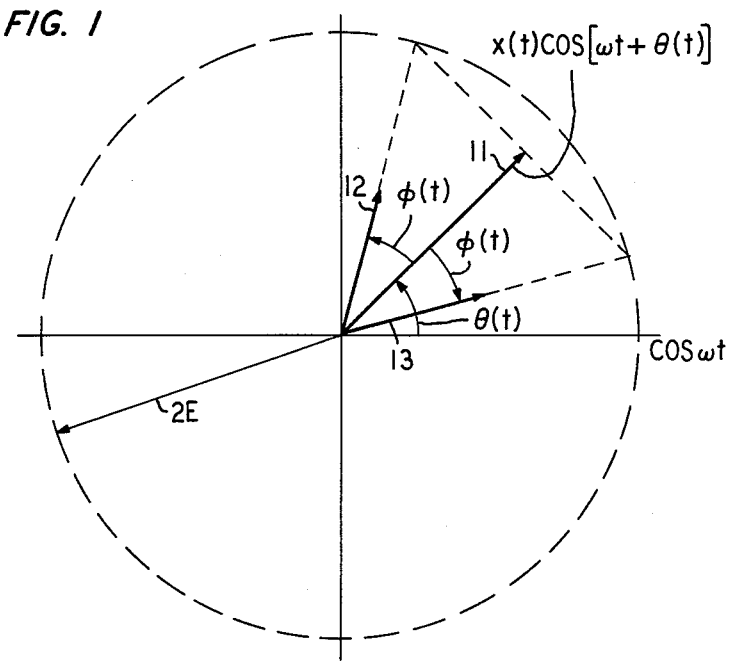
FIG. 1 depicts the Cox phasor decomposition of signals.

As indicated previously, the accuracy in decomposing signal vector 11 in FIG. 1 into vector signals 12 and 13 depends on the accuracy with which $\theta(t)$ is known. Erroneously estimating $\theta(t)$ at, say, $\theta(t)+\delta$, would cause an error in evaluating $\phi(t)$ and the developed two signal vectors would combine to a signal at angle $\theta(t)+\delta$. This error can be recovered if, instead of decomposing the signal $x(t) \cos[\omega t+\theta(t)]$, the projections of that signal on reference signal (at angle $\omega t+\delta$) and on an orthogonal reference signal (at angle $\omega t+\delta+90$) are each decomposed into two constant amplitude signal vectors. The angle $\delta$ may be 0, $\theta(t)$, or any other angle, including one that merely approximates $\theta(t)$. For best efficiency of operation, it can be shown that the angle $\delta$ should equal $\theta(t)$ (realizing thereby the Cox approach and eliminating the need for the orthogonal set of reference signals) or, when $\theta(t)$ cannot correctly be ascertained, the angle $\delta$ should approximate $\theta(t)$.

Thus, in accordance with the principles of this invention, the input signal to be amplified is referenced to an approximation of the input signal's instantaneous frequency and is represented by four components. One pair of the components are constant amplitude phasors located symmetrically about the developed reference, and the other pair of the components are constant amplitude phasors located symmetrically about a reference signal orthogonal to the developed reference signal.

Figure 3:
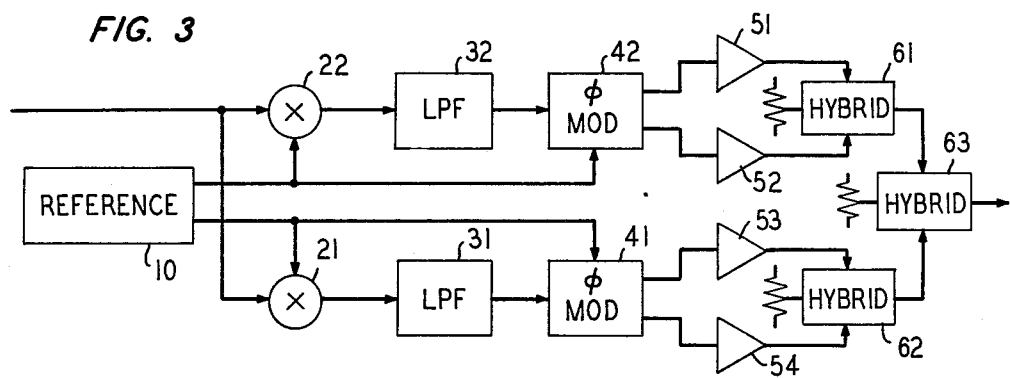
FIG. 3 illustrates one embodiment of apparatus employing the principles of this invention.

The apparatus of FIG. 3 implements the principles of this invention. Therein, reference circuit 10 is responsive to the input signal and develops therefrom two reference signals $\cos[\omega t+\xi(t)]$, and $\sin[\omega t+\xi(t)]$, where $\xi(t)$ is an approximation of the angle $\theta(t)$ in the input signal $x(t)\cos[\omega t+\theta(t)]$. The developed reference signal $\cos[\omega t+\xi(t)]$ and the incoming signal are applied to modulator 22, and the developed reference signal $\sin[\omega t+\xi(t)]$ and the incoming signal are applied to modulator 21. The lower sidebands resulting from the modulation processes are selected in low-pass filters 32 and 31 (connected to modulators 22 and 21, respectively), yielding the signal $(x(t)/2)\cos[\theta(t)-\xi(t)]$ at the output of filter 32 and the signal $(-x(t)/2)\sin[\theta(t)-\xi(t)]$ at the output of filter 31. These signals are the projection of the input signal (at angle $\theta(t)$) upon the orthogonal set of reference signals (at angles $\xi(t)$ and $\xi(t)+\pi/2$).

The apparatus of FIG. 3 further includes phase modulator 42 responsive to filter 32 and to the reference signal $\cos[\omega t+\xi(t)]$, and phase modulator 41 responsive to filter 31 and to the reference signal $\sin[\omega t+\xi(t)]$. In modulator 42, the signal $(x(t)/2)\cos[\theta(t)-\xi(t)]$ is equated to the arc-cos of an angle $\phi_1(t)$, and the angle $\phi_1(t)$ is phase modulated onto the reference signal to yield the signals $\cos[\omega t+\xi(t)+\phi_1(t)]$, and $(-x(t)/2)\cos[\omega t+\xi(t)-\phi_1(t)]$. A similar process takes place in modulator 41, yielding the phase modulated signals $\sin[\omega t+\xi(t)-\phi_2(t)]$ and $\sin[\omega t+\xi(t)+\phi_2(t)]$, where $\phi_2(t)$ is equal to the arc-cos of $(-x(t)/2)\sin[\theta(t)-\xi(t)]$.

Resulting from these operations are four constant (and equal) magnitude phasors with one pair straddling the reference signal $\cos[\omega t+\xi(t)]$ and the other pair straddling the reference signal $\sin[\omega t+\xi(t)]$.

The power in the four phasors is increased by a factor G in amplifiers 51, 52, 53 and 54 with amplifiers 51 and 52 amplifying the first pair of phasors, and amplifiers 53 and 54 amplifying the second pair of phasors. The resultant signals are $G\cos[\omega t+\xi(t)\pm\phi_1(t)]$ and $G\cos[\omega t+\xi(t)\pm\phi_2(t)]$.

Having amplified the signals to the desired power level, the signals are interfered, or combined, to form the desired band limited signal. This is achieved with hybrid circuits 61, 62, and 63. More specifically, hybrid 61 combines the output signals of amplifiers 51 and 52 ($G\cos[\omega t+\xi(t)+\phi_1(t)]$ and $G\cos[\omega t+\xi(t)-\phi_1(t)]$) yielding the signal $2G\cos[\phi_1(t)]\cos[\omega t+\xi(t)]$, and hybrid circuit 62 combines the output signals of amplifiers 53 and 54, yielding the signal $2G\cos[\phi_2(t)]\sin[\omega t+\xi(t)]$. Since $\phi_1(t)$ equals $\cos^{-1}\{(x(t)/2)\cos[\theta(t)-\xi(t)]\}$ and $\phi_2(t)$ equals $\cos^{-1}\{(-x(t)/2)\sin[\theta(t)-\xi(t)]\}$ the output signals of hybrids 61 and 62 are $Gx(t)/2\cos[\theta(t)-\xi(t)]\cos[\omega t+\xi(t)]$ and $-Gx(t)/2\sin[\theta(t)-\xi(t)]\sin[\omega t+\xi(t)]$, respectively. Combining the latter two signals in hybrid 63 results in the signal $[G/2]x(t)\cos[\omega t+\theta(t)]$, which is a replica of the input band limited signal, multiplied by $G/2$.

In constructing the various elements in the apparatus of FIG. 3, the hybrids may be conventional transformer coupling networks, the amplifiers may be of the type described by Cox in the aforementioned patent, and the amplitude modulation and bandpass filters may also be of conventional design.

The phase modulators of FIG. 3 perform the functions of converting the input signal to an angle whose cosine is equal to the input signal, and of phase modulation. The arc-cos transformation in modulators 41 and 42 may be obtained in accordance with the feedback principles shown by Cox in the aforementioned patent and by Redman in U.S. Pat. No. 3,987,366, or in accordance with the principles disclosed in my copending application entitled "Inversion Using Successive Approximation", Ser. No. 777,636, filed Mar. 15, 1977. When operating at very high frequencies, it may turn out more advantageous to realize the arc-cos transformation and phase modulation with minimum amount of feedback as disclosed in my copending application entitled "High Frequency Inverse Cosine Circuit", Ser. No. 817,352, filed July 20, 1977.

As for reference circuit 10, all that is required is the development of two orthogonal reference signals at frequency $\omega$, as in the Weaver system. As indicated previously, however, higher efficiency may be obtained by shifting one of the reference signals to more closely approximate the instantaneous frequency of the input signal, $[\omega+\theta(t)]$. Accordingly, it is contemplated to develop reference signal $\cos[\omega t+\xi(t)]$, where $\xi(t)$ approximates $\theta(t)$, and a reference signal orthogonal thereto, namely, $\sin[\omega t+\xi(t)]$.

Figure 2:
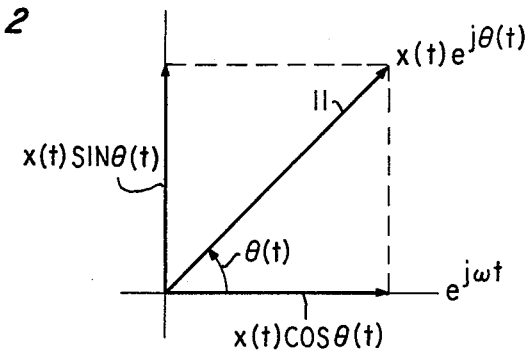
FIG. 2 depicts the Weaver phasor decomposition of signals.

The angle ξ(t) may be derived from Cox's embodiment of the circuit for evaluating the angle θ(t) because, as indicated previously, Cox develops an approximation to the angle θ(t) and not the angle itself. Approaches even simpler than Cox's are also available since ξ(t) is not required to closely approximate θ(t). The system of this invention will work with any approximation of ξ(t), including one that is permanently set to zero. With this wide a latitude, ξ(t) can be approximated by measuring the zero crossings of the input signal, and deriving therefrom an approximation to [ωt+θ(t)]. At instances when the level of the input signal is low, which is when zero crossings are difficult to distinguish (and when Cox's approximation also falters), the system of this invention can conveniently accept whatever value of ξ(t) is obtained. Thus, reference circuit 10 may be realized by implementing the diagram of FIG. 2 in Cox's aforementioned IEEE article, or may simply be a conventional zero crossings detector driving a flip-flop.

What is claimed is:

1. A circuit for amplifying a carrier modulated bandpass signal comprising:
    means for developing a constant amplitude cosine signal and a constant amplitude sine signal from an approximation to the frequency of said bandpass signal;
    means for projecting said bandpass signal on said developed cosine signal and said developed sine signal to form a cosine projection signal and a sine projection signal, respecitvely;
    means for separating said cosine projection signal into first and second constant amplitude phase modulated signals;
    means for separating said sine projection signal into third and fourth constant amplitude phase modulated signals;
    means for amplifying and combining said first and second constant amplitude signals to develop a first amplified signal;
    means for amplifying and combining said third and fourth constant amplitude signals to develop a second amplified signal; and
    means for combining said first amplified signal and said second amplified signal to form an amplified replica of said bandpass signal.

2. The circuit of claim 1 wherein said first, second, third, and fourth constant amplitude phase modulated signals are of equal amplitude.

3. The circuit of claim 1 wherein said means for amplifying and combining said first and second constant amplitude signals and said means for amplifying and combining said third and fourth constant amplitude signals include amplifiers of substantially identical gain.

4. The circuit of claim 1 wherein said means for amplifying and combining said first and second constant amplitude signal, said means for amplifying and combining said third and fourth constant amplitude signals and said means for combining said first amplified signal and said second amplified signal include passive hybrid circuits to perform the combining function.

5. The circuit of claim 1 wherein said means for projecting said bandpass signal comprises:
    a first amplitude modulator responsive to said bandpass signal and to said cosine signal followed by a first low-pass filter for developing said cosine projection signal; and
    a second amplitude modulator responsive to said bandpass signal and to said sine signal followed by a second low-pass filter for developing said sine projection signal.

6. The circuit of claim 1 wherein said means for separating said cosine projection signal comprises:
    a first means for transforming said cosine projection signal into an angle signal whose cosine is equal to said cosine projection signal;
    second means for phase modulating said cosine signal with said angle signal; and
    third means for phase modulating said cosine signal with the negative of said angle signal.

7. The circuit of claim 1 wherein said means for developing said cosine signal and said sine signal develops said cosine and sine signals from an approximation to the center frequency of said bandpass signal.

8. The circuit of claim 1 wherein said means for developing said cosine signal and said sine signal develops said cosine and sine signals from an approximation to the instantaneous frequency of said bandpass signal.

9. A circuit for amplifying a bandpass signal comprising:
    a reference circuit for developing a first reference signal approximately equal to the center frequency of said bandpass signal and for developing a second reference signal orthogonal to said first reference signal;
    a first amplifying path responsive to said bandpass signal and to said first reference signal for developing an amplified projection of said bandpass signal on said first reference signal;
    a second amplifying path responsive to said bandpass signal and to said second reference signal for developing an amplified projection of said bandpass signal on said second reference signal; and
    means for combining said amplified projections, with each of said amplifying paths being of identical construction and including:
        an amplitude modulator responsive to said bandpass signal and to the applied reference signal;
        a low-pass filter responsive to said amplitude modulator;
        a phase modulator for modulating said applied reference signal with an angle equal to the arc cosine of the signal developed by said bandpass filter and for further modulating with the negative of said angle; and
        means for amplifying said modulated signals.

10. An interferometric amplifier responsive to an amplitude modulated input signal, developing constant amplitude phase modulated signals that are amplified and passively combined to form an amplitude modulated signal CHARACTERIZED BY:
    circuitry for developing two constant amplitude phase modulated signals whose sum lies along a first reference signal approximating the instantaneous frequency of said input signal and equals the projection of said input signal on said first reference signal; and
    circuitry for developing two constant amplitude phase modulated signals whose sum lies along a second reference signal orthogonal to said first reference signal and equal to the projection of said input signal on said second reference signal.

* * * * *